United States Patent
Badi et al.

(10) Patent No.: US 9,318,626 B2
(45) Date of Patent: Apr. 19, 2016

(54) BORON NITRIDE ANTI-REFLECTION COATINGS AND METHODS

(71) Applicant: The University of Houston, Houston, TX (US)

(72) Inventors: Nacer Badi, Houston, TX (US); Alex Freundlich, Houston, TX (US); Abdelhak Bensaoula, Houston, TX (US); Andenet Alemu, Houston, TX (US)

(73) Assignee: THE UNIVERSITY OF HOUSTON, Houston, TX (US)

( * ) Notice: Subject to any disclaimer, the term of this patent is extended or adjusted under 35 U.S.C. 154(b) by 17 days.

(21) Appl. No.: 14/259,709

(22) Filed: Apr. 23, 2014

(65) Prior Publication Data

US 2014/0230893 A1 Aug. 21, 2014

Related U.S. Application Data

(62) Division of application No. 12/410,276, filed on Mar. 24, 2009, now Pat. No. 8,716,595.

(60) Provisional application No. 61/070,561, filed on Mar. 24, 2008.

(51) Int. Cl.
*H01L 21/00* (2006.01)
*H01L 31/0216* (2014.01)

(52) U.S. Cl.
CPC .......... *H01L 31/02168* (2013.01); *Y02E 10/50* (2013.01)

(58) Field of Classification Search
CPC combination set(s) only.
See application file for complete search history.

(56) References Cited

U.S. PATENT DOCUMENTS

| | | | |
|---|---|---|---|
| 4,614,433 A | 9/1986 | Feldman et al. | |
| 5,230,873 A | 7/1993 | Wildenburg et al. | |
| 5,712,030 A * | 1/1998 | Goto et al. | 428/332 |
| 5,718,961 A | 2/1998 | Hong | |
| 5,846,649 A | 12/1998 | Knapp et al. | |
| 5,895,938 A | 4/1999 | Watanabe et al. | |
| 6,452,331 B1 | 9/2002 | Sakurada et al. | |
| 6,804,010 B1 | 10/2004 | Stirniman | |
| 2003/0035261 A1 | 2/2003 | Bensaoula et al. | |
| 2004/0025932 A1* | 2/2004 | Husher | 136/256 |
| 2005/0224108 A1 | 10/2005 | Cheung | |

OTHER PUBLICATIONS

Abdellaoui et al; Materials Science and Engineering, B47 (1997) 257-262.
Davis, et al; Advances in Solid State Physics, 1995, vol. 35, 1-24.
Friedman et al; J. of Appl. Physics, vol. 76, No. 5, p. 3088-3101, Sep. 1994 (abstract only).

(Continued)

*Primary Examiner* — Eli Mekhlin
(74) *Attorney, Agent, or Firm* — Jackson Walker LLP; Christopher J. Rourk

(57) ABSTRACT

High performance photovoltaic devices are provided. Certain embodiments relate to the use of Boron-Nitride (BN) thin films as anti-reflection coating (ARC) material on Si and GaAs solar cells. A low and wide reflectance window covering a large energy range of the solar spectrum is available. For a large part of the useful solar spectrum, the index of refraction of the grown BN thin films remains constant at about 2.8. In another embodiment, a BN ARC is applied directly on ordinary window glass providing the device's mechanical strength.

5 Claims, 5 Drawing Sheets

(56) References Cited

OTHER PUBLICATIONS

Poulachon et al; Tool-Wear Mechanisms in Hard Turning With Polycrystalline Cubic Boron Nitride Tools; Wear 250 (2001) 576-586.

Song, et al; Nano Lett. 2010, 10, 3209-3215.

Xu et al; Calculation of Ground-State and Optical Properties of Boron Nitrides in the Hexagonal, Cubic, and Wurtzite Structures; Phys. Rev., B 44, 7787-7798 (1991).

* cited by examiner

US 9,318,626 B2

BORON NITRIDE ANTI-REFLECTION COATINGS AND METHODS

CROSS-REFERENCE TO RELATED APPLICATION

The present application is a divisional of U.S. Pat. No. 8,716,595, filed Mar. 24, 2009, and claims priority to and the benefit of Provisional Patent Application Ser. No. 61/070,561, filed Mar. 24, 2008 each of which are hereby incorporated by reference for all purposes.

FEDERALLY SPONSORED RESEARCH OR DEVELOPMENT

Not Applicable.

REFERENCE TO A "SEQUENTIAL LISTING"

Not Applicable.

TECHNICAL FIELD OF THE INVENTION

This invention relates to the field of anti-reflection coatings, particularly with regard to high performance photovoltaic devices. This invention particularly relates to the use of BN thin films as anti-reflection coating (ARC) material such as in the use on Si and III-V semiconductor based single- and multi-junction (e.g., GaAs) solar cells.

BACKGROUND

Solar cells convert solar radiation and other light into usable electrical energy. In a typical solar cell, solar radiation such as sunlight impinges on the solar cell and is absorbed by an active region of semiconductor material such as a film of silicon (Si) and/or gallium arsenide (GaAs), which generates electron-hole pairs in the active region. The electrons and holes may be separated by an electric field of a junction in the solar cell. It is this separation of the electrons and holes by the junction that results in the generation of a photocurrent.

The semiconductors often used as solar cell materials such as silicon and gallium arsenide typically reflect approximately 30% of the incident light that could otherwise participate in the generation of the photocurrent. The reflection losses of these photons may be reduced through the use of an Anti-Reflection Coating (ARC). A typical ARC is a layer consisting of the deposition of one or more thin film materials with carefully chosen thicknesses and refractive indexes. Oxide ARCs are commonly used in solar cell fabrication (Silicon oxi-nitrides, GaO, etc.). $MgF_2$/ZnS is also often used as a double layer ARC for solar cells as it provides an ideal index match for cells with bandgaps ranging from 0.7-2 eV. An example of a conventional solar cell is shown in FIG. 1. FIG. 1 is a cross-sectional view of a solar cell consistent with certain conventional solar cells. Solar cell absorber 1 is provided with a glass or air layer 4. Between glass or air layer 4 and the solar cell absorber are typically two layers, for example, a thin film of ZnS, shown as ZnS layer 2 and a thin film of a $MgF_2$, shown as $MgF_2$ layer 3. Glass or air layer 4 may be comprised of any suitable substantially transparent substance known in the art for this application, including glass, or it may be comprised of air. The substantially transparent substance of glass or air layer 4 may affixed by such means as an epoxy or other suitable material.

These conventional methods of protecting solar cells suffer from a number of disadvantages. For instance, for conventional ARC schemes, a protective cover glass is needed to prevent premature aging of solar cells as a result of ARC degradation through weather effects, corrosion, and particle impact, for example. The addition of cover glasses, however, results in both optical losses and added manufacturing complexity and cost. In addition, some conventional ARC schemes may not be transparent over the entire desired range of the solar radiation spectrum. Accordingly, improved ARC schemes are needed to address one or more of the disadvantages of the prior art.

SUMMARY

The present invention relates to the use of Boron-Nitride (BN) thin films as anti-reflection coating (ARC) materials, for instance, on Si and GaAs solar cells.

A solar cell according to one aspect of the invention includes a photovoltaic layer and a substantially transparent substance on a light incident side of the photovoltaic layer. The solar cell further includes an anti-reflection coating disposed on the light-incident side of the photovoltaic layer wherein the anti-reflection coating comprises a layer comprising BN so as to form a BN layer. The layer comprising BN has a light incident side.

A solar cell according to another aspect of the invention includes a photovoltaic layer with a semi-conductor selected from the group consisting of silica and gallium arsenic. The photovoltaic layer having a light incident side. The solar cell further includes an anti-reflection coating on the photovoltaic layer. The anti-reflection coating is located on a light-incident side of the photovoltaic layer. The antireflection coating comprises a BN layer.

A method of manufacturing a solar cell according to another aspect of the invention includes providing a photovoltaic layer. The photovoltaic layer has a light incident side. The method further includes depositing a BN film on the light incident side of the photovoltaic layer.

A thin film according to another aspect of the present invention includes BN with a refractive index of about 2.8 at 2 eV.

An ARC for use in a solar cell according to another aspect of the present invention includes a plurality of layers, wherein at least one of the layers includes BN.

The features and advantages of the present invention will be apparent to those skilled in the art. While numerous changes may be made by those skilled in the art, such changes are within the spirit of the invention.

BRIEF DESCRIPTION OF THE DRAWINGS

A more complete understanding of the present disclosure and advantages thereof may be acquired by referring to the following description taken in conjunction with the accompanying figures, wherein.

Figure 1:
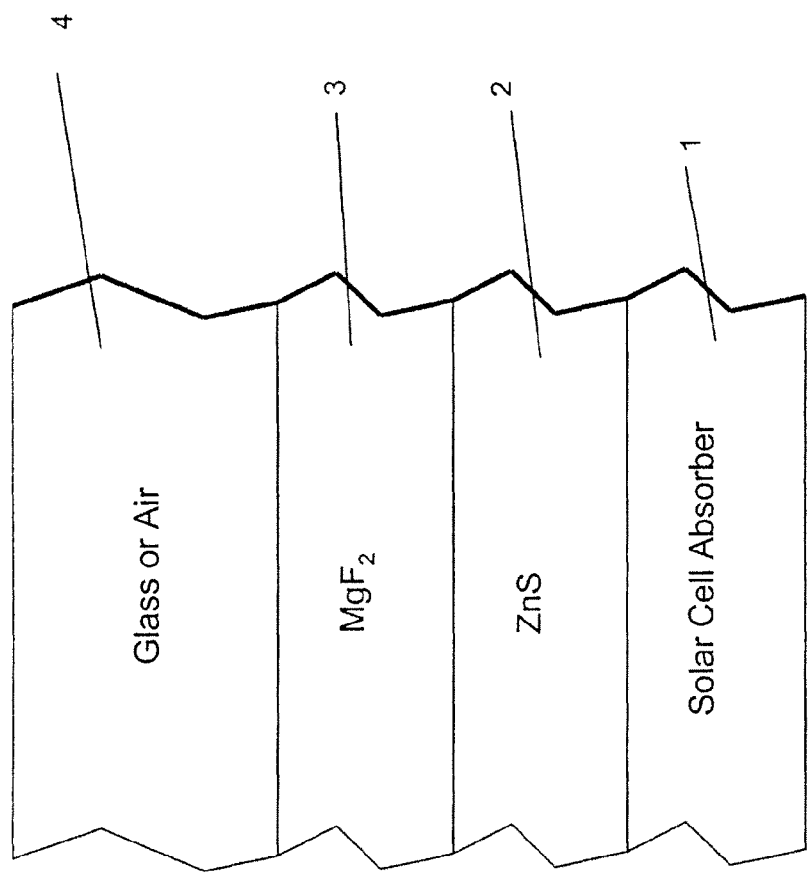
FIG. 1 illustrates a cross-sectional schematic of a conventional solar cell.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DESCRIPTION OF PREFERRED EMBODIMENTS

The present invention relates to the use of Boron-Nitride (BN) thin films as anti-reflection coating (ARC) materials, for instance, on Si and III_V semiconductor-based multi-junction solar cells. It further relates to the use of BN as a protective coating where transparency to sunlight and resistance to physical damage is desired.

BN is a chemically stable ceramic material that displays a wide band gap (6.2 eV) and a refractive index close to that of ZnS and glass. BN has a hardness comparable to that of diamond and is a type III-V semiconductor. In addition, it is mostly biologically inert, i.e., it generally does not harm living organisms that ingest or otherwise physically interact with it.

Figure 2:
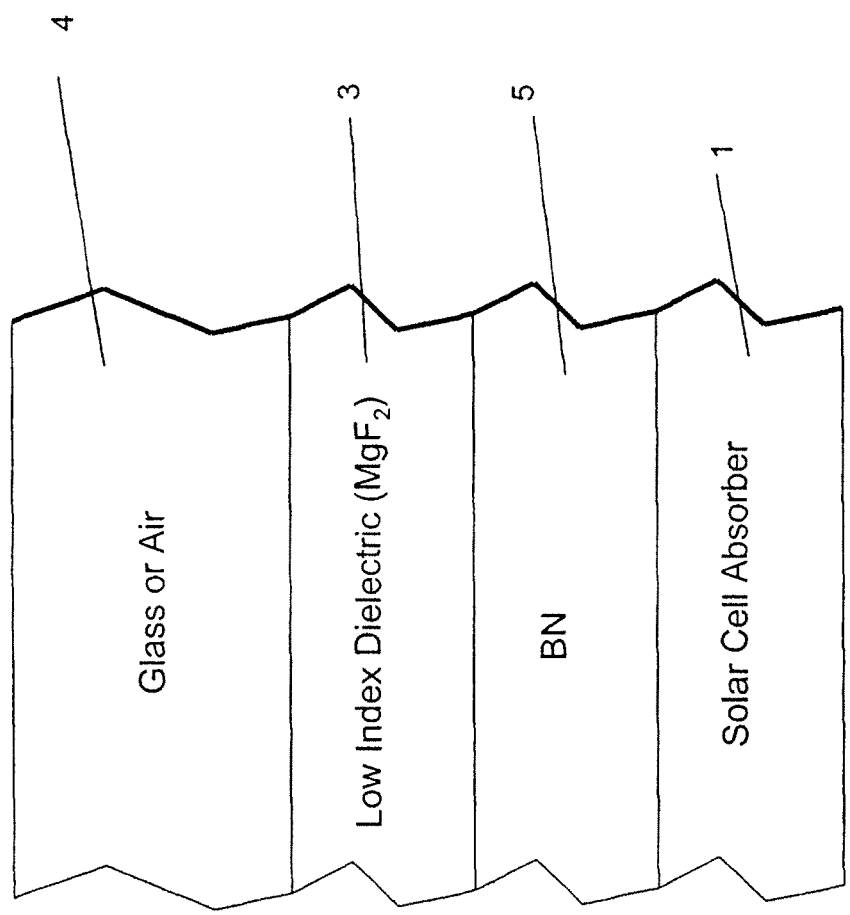
FIG. 2 illustrates a cross-sectional schematic of a solar cell employing a film of BN in accordance with certain embodiments of the present invention.

In part because of these qualities, BN may be used as an ARC in place of certain conventional materials for solar cells. FIG. 2 is a cross-sectional schematic of a traditional solar cell in which the ZnS layer has been replaced with BN layer 5. As BN has a refractive index comparable to ZnS, light travelling through BN layer 5 is not reflected due to differences in refractive indices significantly more than a traditional ZnS layer. For this reason, it may be desirable to use BN as an ARC in solar cells made with materials having a refractive index in excess of 3. This property allows use of BN instead of ZnS by adjusting its thickness to correct for the variation in refractive index values and obtain a satisfactory ARC. Further, BN, unlike ZnS, has a relatively constant refractive index for a large span of the electromagnetic spectrum, which provides for a lower and wider transmission window. Because of its superior hardness and chemical stability, BN layer 5 resists physical damage and degradation due to interaction with elemental oxygen far better than a comparable ZnS layer. When used to replace the ZnS layer, BN layer thickness can be determined by one of ordinary skill in the art by minimizing reflection losses, for instance, such as by solving equation (3) described in example 3, below. For typical solar cell applications BN layer 5 ranges in thickness between about 300 and about 1500 Å, preferably between about 500 and about 800 Å. In addition, as shown in FIG. 2, MgF$_2$ layer 3 has been replaced with low index dielectric layer (MgF$_2$) 3 to reflect that in some embodiments of the present invention, MgF$_2$ may be replaced with other low index dielectrics, as understood by one of ordinary skill in the art with the benefit of this disclosure.

Figure 3:
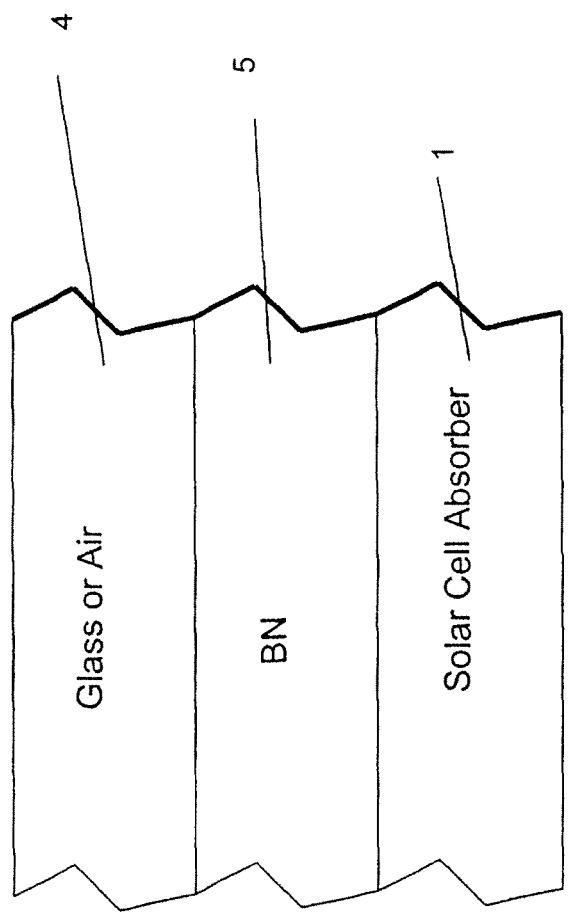
FIG. 3 illustrates a cross-sectional schematic of a solar cell employing a film of BN in accordance with certain alternate embodiments of the present invention.

FIG. 3 is a cross-sectional schematic of a traditional solar cell in which the ZnS layer and the low index dielectric layer have been replaced with BN layer 5. In certain embodiments of the present invention, glass may be omitted as BN may provide the physical protection necessary for the solar cell itself. The BN layer as described above can be thus used to replace both the ZnS layer, the low index dielectric layer, and the protective cover glass.

The protection that BN offers may be used in other applications beyond that of solar cells. Because BN layers have optical properties similar to that of glass, such as refractive index, BN layers may be used as interfacial layers for optoelectronic devices and ARC for optics, including eyeglasses. The chemical inertness and hardness of BN makes BN layers useful for tribological applications and certain medical devices, such as artificial joints and implantable electronics.

BN layers may be deposited onto surfaces by spin coating, dip coating, flow coating techniques, or physical vapor deposition (PVD) techniques. One method of PVD suitable for the present invention is described in U.S. Pat. No. 6,939,775, which is incorporated herein by reference. In certain embodiments of the present invention, the BN layer is formed by PVD at about 350° C. and below from sources of boron and nitrogen.

The BN layer formed by PVD may have certain crystal structure characteristics. For instance, in certain embodiments, the BN layer has a crystal structure that includes at least 3% cubic phase. One method of depositing BN with at least 3% cubic phase consistent with the present invention is to use a nitrogen source that releases excited nitrogen. Including 3% of cubic phase BN results in a BN layer having certain desired characteristics such as high thermal conductivity to reduce energy losses and increased hardness. In certain other embodiments of the present invention, BN can also have a hex crystal structure or an amorphous crystal structure. BN films could be microcrystalline or polycrystalline with grain sizes less than about 1 micron. In some embodiments of the present invention, the deposition rate is controlled to about 0.2 Å/s or less, with particularly advantageous deposition rates being below about 0.1 Å/s. By controlling BN deposition rates to these rates, it is possible to increase the nitrogen/boron ratio in the BN film, improving the overall film characteristics.

EXAMPLES

To facilitate a better understanding of the present invention, the following examples of certain aspects of some embodiments are given. In no way should the following examples be read to limit, or define, the scope of the invention.

Example 1

High quality hexagonal BN thin films were grown in a high vacuum reactor by ion assisted physical vapor deposition technique at between 250° C. and 350° C. with a deposition rate of 0.1-0.2 Å/s. High purity boron was evaporated by electron beam and controlled by a quartz crystal rate monitor. The nitrogen species were delivered by a gridless End Hall ion source (Commonwealth Scientific Mark II) fed with high purity (99.9999%) N$_2$. The End Hall ion source provides nitrogen species with energy from 20 to 100 eV and ion beam current from 30 to 300 mA. The N$_2$ flow through the ion source was kept constant at 2.5 sccm and was proportional to the flux density of the nitrogen beam. It consists of a mixture of N$^+_2$ and N$^+$ with typical N$^+_2$/N$^+$=6. BN thin film was deposited on GaAs substrate and the pressure during deposition was in the mid 10$^{-5}$ Torr. In situ Auger electron spectroscopy (AES) measurement was performed to verify the cleanliness of the substrate prior to deposition and to monitor the post growth surface composition. The relative atomic composition of the film was calculated from peak heights of the Auger KLL boron and nitrogen transitions. The thickness of the BN thin film was measured by an α-step profilometer.

Example 2

A series of BN thin films were grown with the reaction conditions of Example 1 in order to determine the most effective evaporation rates for boron to maximize the nitrogen content. The ion beam current and energy were maintained at 110 mA and 45 eV, respectively and the evaporation rate was varied to determine the most effective rate. An evaporation rate of approximately 0.1 Å/s for boron yielded the maximum surface nitrogen content compared to higher rates. In this example, the thickness of the studied BN film was about 600 Å.

Example 3

Using the methodology explained below, individual layers of $MgF_2$ and BN along with the gallium arsenide bare substrate were analyzed by Spectroscopic Ellipsometry (SE) to determine the optical response of the layers. Once the optical constants had been determined individually, analysis of the ARC stack was performed.

The structural model used for the fitting of the ARC on gallium arsenide or silicon in addition to a stack of $MgF_2$/BN layers included an "intermixing" layer representing a 50/50 mixture of the adjoining materials and was modeled mathematically on the effective medium approximation (EMA), as explained in D. E. Aspnes, *Thin Solid Films* 89 p.249 (1982), which is incorporated herein by reference, and the surface roughness layer, which is essentially an intermix layer between the slightly non-planar surface of the film and the ambient.

For the reflectance spectrometry, a tungsten halogen broad-spectrum white light source, extending towards the infrared but limited in the blue region of the spectrum, was used in conjunction with a Jobin-Yvon® monochromator and a silicon detector. The useful range of the reflectance spectra was limited to below 2.5 eV due to the spectral composition of the light source. This technique permitted direct comparison of measured reflectivity to simulated reflectance results deduced from the n and k values extracted from Ellipsometry.

A Fortran® based simulation code using the transfer matrix method, (i.e., Born, M.; Wolf, E., *Principles of optics: electromagnetic theory of propagation, interference and diffraction of light*. Oxford, Pergamon Press, 1964.) which is incorporated herein by reference, was used to predict the reflectance spectra for different thicknesses of AR coating layers (BN, MgF2) and on different substrates (GaAs, Si). In this model, each layer i is characterized by its refractive index $n_i$ and its' corresponding thickness $d_i$ so that the phase change $\phi_i$ of the electromagnetic radiation passing through that layer is given by:

$$\varphi_i = n_i \frac{\omega}{c} d_i \quad (1)$$

where ω represents the frequency of the incident light and c its celerity.

The model associates a 2×2 matrix for each layer that are in the following form:

$$\hat{\beta}_i = \begin{pmatrix} \cos\varphi_i & j\frac{\sin\varphi_i}{n_i} \\ jn_i\sin\varphi_i & \cos\varphi_i \end{pmatrix} \quad (2)$$

The relationship between the electric field components of the light before (initial) and after (final) the stack is the expressed by:

$$\begin{pmatrix} E_+ \\ E_- \end{pmatrix}_{final} = (\hat{S}_a)^{-1} \hat{B}_N \hat{B}_{N-1} \hat{B}_{N-2} \ldots \hat{B}_1 \hat{S}_a \begin{pmatrix} E_+ \\ E_- \end{pmatrix}_{initial} \quad (3)$$

The + and − subscripts indicate the direction of light travel whereas $\hat{S}_a$ describes the ambient environment where the stacks are found (air in this case).

The total reflection intensity R of the stack is then given by:

$$R = \left| \frac{(E_-)_f}{(E_+)_i} \right|^2 = |r|^2 \quad (4)$$

Once a reasonable set of thicknesses was determined offering high and large transmission window around the bandgap of the coated substrate, these thicknesses were used as the targeted optimal deposition for fabrication of the AR coating layers. The refractive index and extinction coefficient were measured by Ellipsometry using the model described above. The value of the BN refractive index was determined to be 2.8 at 2 eV.

Figure 4:
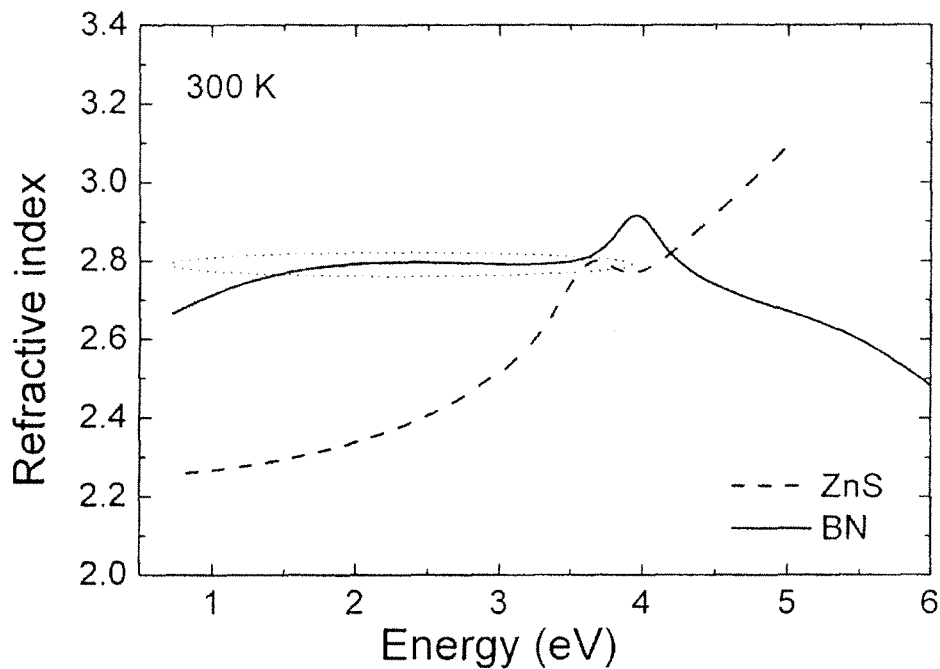
FIG. 4 illustrates a graphical comparison of refractive indexes of ZnS and BN films.

FIG. 4 shows a comparison between the refractive indexes of these two films deposited and measured. Both values vary somewhere between 2 and 3.

Figure 5:
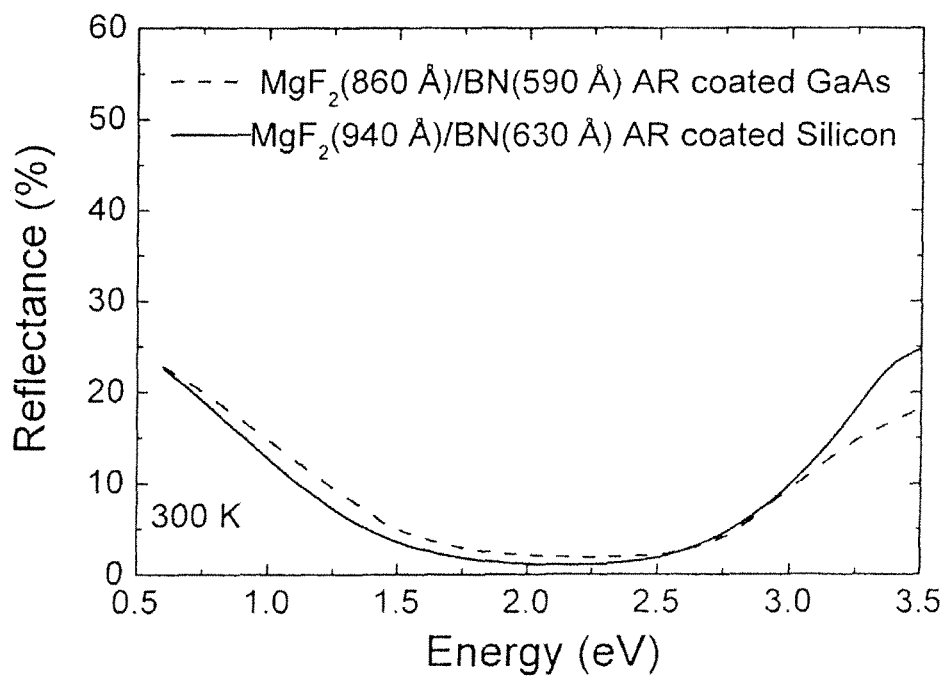
FIG. 5 illustrates $MgF_2$/BN/GaAs reflectance deduced from measured n and k values of $MgF_2$.

Using the above described transfer matrix formalism based computer code optimal thicknesses for a good AR coating were estimated to be ~0.1 μm for $MgF_2$ and 0.06 μm for BN. While these thicknesses were set to yield minimal reflection losses for GaAs and Si single junction solar cell, one skilled in the art would be capable of extending the approach to other applications and fine tune thicknesses for that particular application. The simulation derived from ellipsometry measurement of n and k for these layers grown on GaAs and Si shows that BN is indeed suitable for such application, as demonstrated by the experimental data shown in FIG. 5.

Figure 6:
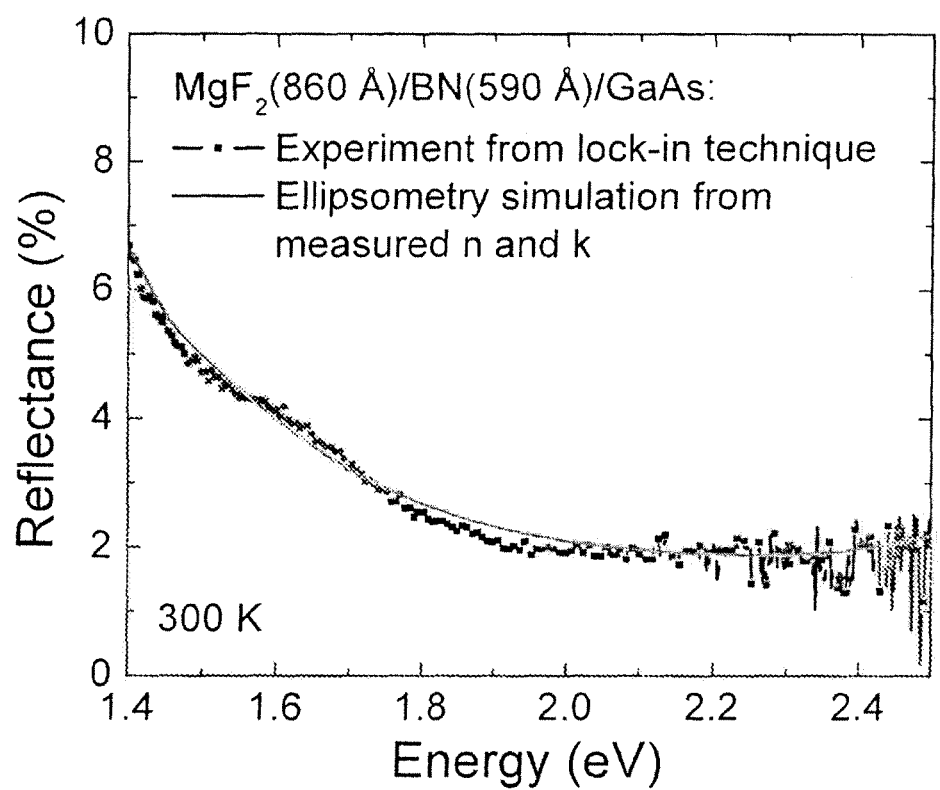
FIG. 6 illustrates a graphical comparison of reflectances of MgF$_2$/BN coated GaAs.

We have also undertaken a direct comparison between the reflectance deduced from ellipsometry and the spectra obtained from reflectance spectroscopy using a lock-in technique. As shown in FIG. 6, there is general agreement between these two methods.

Although the invention described here specifically focuses on the application to solar cells, one of ordinary skill in the art, with the benefit of this disclosure, would recognize the extension of BN thin-film based antireflection (or reflective coatings) to other applications; this includes the application of the invention to ARC (or reflective) transparent coatings for other semiconductor optoelectronic devices (photodetectors, lasers, and light emitting diodes), or optics and specialty glass industries (corrective lenses, beam splitters, etc).

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee.

What is claimed is:

1. A method of manufacturing a solar cell having a boron nitride (BN) anti-reflective coating, the method comprising:
    providing a photovoltaic layer, the photovoltaic layer having a light incident side; and
    depositing a BN film on the light incident side of the photovoltaic layer using a physical vapor deposition process as a thin film having a thickness between about 500 Å and about 800 Å, further comprising:
        providing a high purity nitrogen source at a flow rate proportional to a flux density of a nitrogen beam; and
        evaporating a high purity boron source,
    wherein the nitrogen source releases excited nitrogen; and
    wherein the physical vapor deposition is performed at a temperature of between about 250° C. and about 350° C., the BN film is deposited at a rate of less than 0.2 Å/s, the photovoltaic layer comprises a semiconductor selected from the group consisting of silicon and gallium arsenide, the BN film has a refractive index of between 2 and 2.8 at 2 eV, the BN film is polycrystalline and the BN film has grain sizes of less than 1 micron.

2. The method of claim 1, wherein the high purity nitrogen source is provided with energy from 20 to 100 eV.

3. The method of claim 1, wherein the high purity nitrogen source is provided with energy from 20 to 100 eV and ion beam current from 30 to 300 mA.

4. The method of claim 1, wherein the high purity nitrogen source is provided with energy from 20 to 100 eV and ion beam current from 30 to 300 mA at a flow rate of 2.5 sccm.

5. The method of claim 1, wherein the high purity nitrogen source is provided with energy from 20 to 100 eV and ion beam current from 30 to 300 mA at a flow rate of 2.5 sccm with a film deposition pressure of $10^{-5}$ Torr.

* * * * *